United States Patent [19]
James

[11] Patent Number: 6,134,284
[45] Date of Patent: Oct. 17, 2000

[54] CIRCUIT AND METHOD FOR RECEIVING SYSTEM CLOCK SIGNALS

[75] Inventor: Norman Karl James, Austin, Tex.

[73] Assignee: International Business Machines Corporation, Armonk, N.Y.

[21] Appl. No.: 09/062,691

[22] Filed: Apr. 20, 1998

[51] Int. Cl.$^7$ ...................................................... H04L 7/00
[52] U.S. Cl. ............................................... 375/354; 371/1
[58] Field of Search ................................... 375/354, 375, 375/376; 331/1 A; 365/233

[56] References Cited

U.S. PATENT DOCUMENTS

| | | | |
|---|---|---|---|
| 4,937,476 | 6/1990 | Bazes . | |
| 5,517,532 | 5/1996 | Reymond | 375/354 |
| 5,596,610 | 1/1997 | Leung et al. | 375/376 |
| 5,694,086 | 12/1997 | Port et al. | 331/1 A |
| 5,712,884 | 1/1998 | Jeong | 375/375 |
| 5,818,884 | 10/1998 | Reymond | 375/354 |
| 6,028,816 | 2/2000 | Takemae et al. | 365/233 |

OTHER PUBLICATIONS

Mel Bazes; Two Novel Fully Complementary Self–Biased CMOS Differential Amplifiers; Feb. 1991, IEEE Journal of Solid State Circuits, vol. 26, No. 2.

*Primary Examiner*—Stephen Chin
*Assistant Examiner*—Thomas E McKiernan
*Attorney, Agent, or Firm*—Russell D. Culbertson; Anthony V. S. England

[57] ABSTRACT

A clock receiver system (10) includes a clock receiver circuit (14), a phase-lock loop circuit (15), and a clock receiver mirror circuit (16). The clock receiver circuit (14) comprises a differential amplifier having complementary first and second clock inputs and producing a clock receiver output (20). The clock receiver output (20) is applied as a first input to the phase-lock loop circuit (15). The output of the phase-lock loop circuit comprises a phase-locked clock output (22) which is directed to a clock distribution arrangement (25). The signal at the clock distribution arrangement (25) is fed back to the second input of the phase-lock loop circuit (15) through the clock receiver mirror circuit (16). The clock receiver circuit (14) and clock receiver mirror circuit (16) are both self-biased and include identical circuit components.

14 Claims, 3 Drawing Sheets

CIRCUIT AND METHOD FOR RECEIVING SYSTEM CLOCK SIGNALS

BACKGROUND OF THE INVENTION

This invention relates to clock receiver circuits for receiving system clock signals on an integrated circuit chip. The invention encompasses both a differential amplifier circuit used in a clock receiver arrangement and a method for receiving system clock signals.

Integrated circuit systems utilize very sophisticated clock signals for operating and synchronizing the various components of the system. Clock signals are generated by a system clock and distributed to the various chips associated with the system. Each chip which receives the system clock signals utilizes the signals to produce an internal or on-chip clock signal which is then distributed within the chip.

Ideally, the clock signal at any point in the system should provide an identical reference signal. However, due to the complexity and size of integrated circuit systems, various delays appear in the system between clock signals at various points in the system. This difference between the clock signals at various points in the system may be referred to as skew or clock error and directly penalizes the cycle time of the system.

One source of clock skew or error arises in the arrangement for receiving system clock signals on chips included in the system. The system clock signals, which comprise two complementary or differential clock signals, are received on the chip by a clock receiver circuit which converts the differential system clock signals to a single-ended clock signal. The single-ended clock signal from the clock receiver circuit is applied to one input of a phase-lock loop circuit. The output of the phase-lock loop circuit is distributed to the various components on the chip through a clock distribution arrangement or network. The signal from the clock distribution arrangement is fed back and applied as the second input of the phase-lock loop circuit. The phase-lock loop circuit is used in the receiving arrangement to ensure that the distributed on-chip clock signal at the clock distribution arrangement is frequency-aligned and phase-aligned with the system clock signals.

The problem in this system clock receiver arrangement is the difference in the delay between the system clock and the phase-lock loop circuit as compared to the delay introduced in the phase-lock loop feedback path from the on-chip clock distribution arrangement. The receiver circuit introduces a certain delay between the system signals and the signals fed as the first input to the phase-lock loop circuit. In order to reduce skew, there should be an identical delay in the feedback loop of the phase-lock loop circuit. However, it has heretofore proven difficult to accurately produce a delay in the phase-lock loop feedback path which is consistently equal to the delay introduced by the clock receiver circuit. One reason for this is that the differential to single-ended signal conversion required by the clock receiver circuit is not a function required in the feedback path. Various circuit elements may be added to the feedback loop to introduce a delay which is intended to correspond to the delay introduced in the clock receiver circuit. However, these introduced elements behave differently than the elements of the clock receiver circuit under various conditions, and thus the delay introduced by these introduced circuit elements in the feedback loop commonly varies from the delay introduced by the clock receiver circuit.

SUMMARY OF THE INVENTION

It is an object of the invention to provide a clock receiver system and method for receiving clock signals which overcome the above-described problem and others associated with system clock receiver arrangements. Another object of the invention is to provide a clock receiver circuit for use in the system.

The objects of the invention are accomplished with a clock receiver circuit which may operate both as a differential amplifier and as a clock receiver mirror circuit without changing the circuit components. In the differential amplifier operation, the circuit has a first input and a second input for receiving the differential system clock signals and provides a single-ended output. In operation as a clock receiver mirror, the circuit requires one input and produces a single mirror clock output. The circuit components in the differential amplifier implementation and the clock receiver mirror implementation are identical.

The clock receiver system according to the invention uses the unique circuit in the differential amplifier form and in the clock receiver mirror form. The differential amplifier form of the circuit is used as the clock receiver for receiving differential system clock signals and producing a single-ended clock receiver output which is applied as a first input to a phase-lock loop circuit. The mirror clock receiver form of the circuit is used in the phase-lock loop feedback path. Since the circuits have identical components, they produce substantially the same delay and thus reduce skew or clock error between the system clock signals and the distributed on-chip clock signals. Also, since the clock receiver or differential amplifier form of the circuit and the clock receiver mirror form of the circuit may have the same layout and be located adjacent to each other on the chip in addition to having the same components, the circuits are affected similarly by changing process conditions. Thus, although the delay produced in each circuit may change with changing process conditions, the delay in each circuit changes substantially in the same fashion in response to the changing process conditions.

The clock receiver circuit according to the invention includes an input stage, an output stage, and a biasing stage. The biasing stage provides a bias signal which is utilized both by the output stage and current source devices associated with the input stage. The variable self-bias provided by the biasing stage enables the circuit to operate at very low supply voltage levels while maintaining desirable gain characteristics. Also, the variable self-bias enables the differential amplifier form of the circuit to operate with a wide range of input signal levels.

The input stage of the circuit according to the invention includes a first complementary pair of transistors which are controlled by the first input. The input stage also includes a second complementary pair of transistors which are controlled by the second input. In differential amplifier operation the first input and second input are connected to receive the differential system clock signals.

When the circuit operates as a clock receiver mirror, it comprises the very same components including the input stage, output stage, and biasing stage. However, the second complementary pair of transistors of the input stage are not controlled by an input signal but rather the bias signal provided by the biasing stage.

An important aspect of the invention is that the clock receiver circuit and the clock receiver mirror circuit are both implemented with a maximum stack height of three transistors. The stack height refers to the number of transistors in a path from the supply voltage $V_{dd}$ to ground. The maximum stack height of three transistors used in the circuit according to the invention allows the circuit to be used with lower supply voltage levels than would be allowable with transistor stack heights over three.

These and other objects, advantages, and features of the invention will be apparent from the following description of the preferred embodiments, considered along with the accompanying drawings.

DESCRIPTION OF THE PREFERRED EMBODIMENTS

Figure 1:
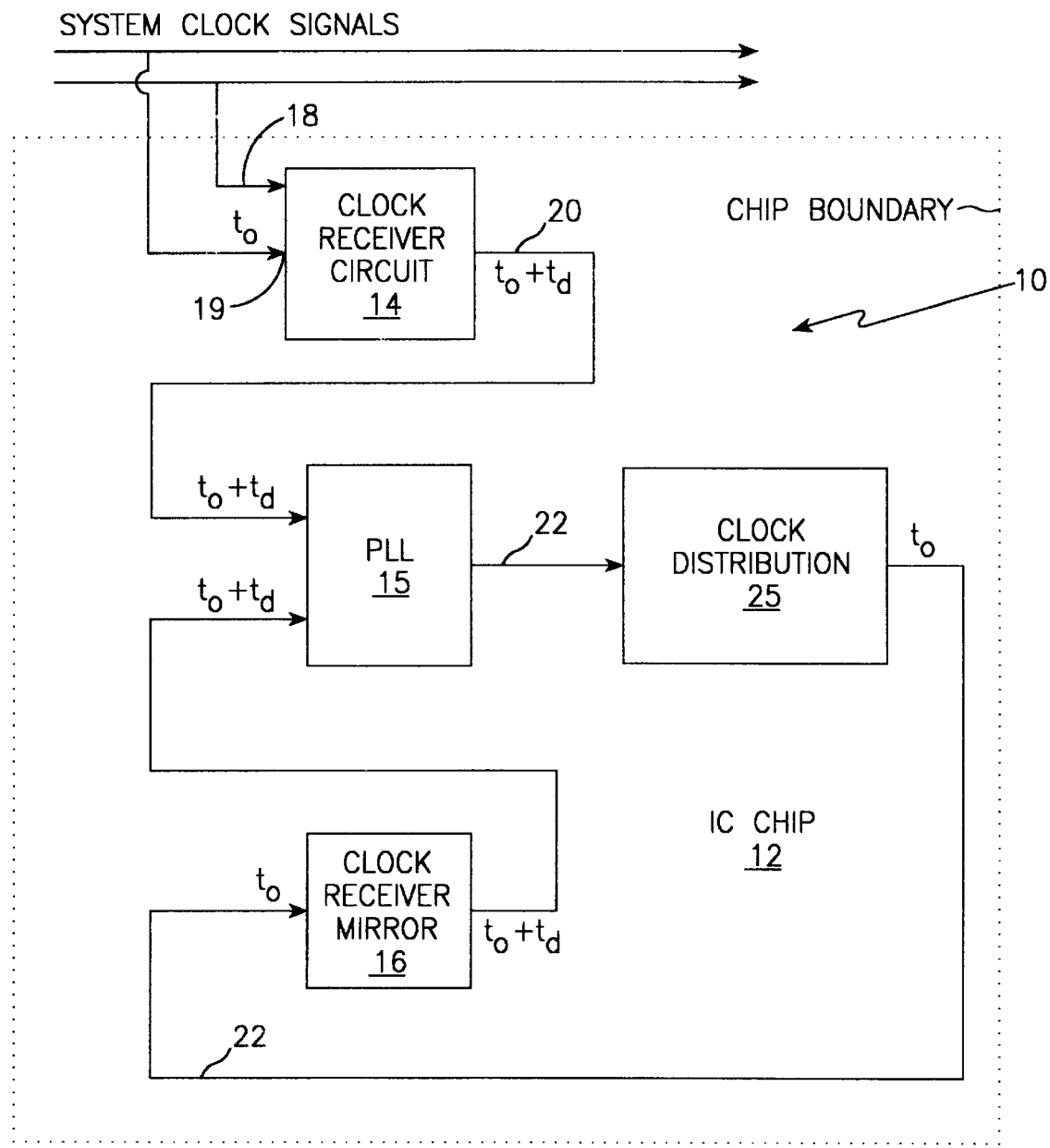
FIG. 1 is a diagrammatic representation of a clock receiver system embodying the principles of the invention.

FIG. 1 shows a clock receiver system 10 embodying the principles of the invention. The clock receiver system is implemented on an integrated circuit chip 12 and adapted to receive system clock signals to produce an on-chip clock signal for use by the various components implemented on the chip.

The clock receiver system 10 includes a clock receiver circuit 14, a phase-lock loop circuit 15, and a clock receiver mirror circuit 16. The clock receiver circuit 14 comprises a differential amplifier and is adapted to receive the differential system clock signals at first and second inputs, 18 and 19, respectively, and produce a single-ended clock receiver output at line 20. The clock receiver output is applied as one input to the phase-lock loop circuit 15. The phase-locked clock output 22 from the phase-lock loop circuit 15 is distributed to the various components on the chip 12 through a clock distribution arrangement or network 25. The distributed clock signal from the distribution arrangement 25 is fed back to the second input of the phase-lock loop circuit 15. Clock receiver mirror circuit 16 is interposed in this feedback loop.

Figure 2:
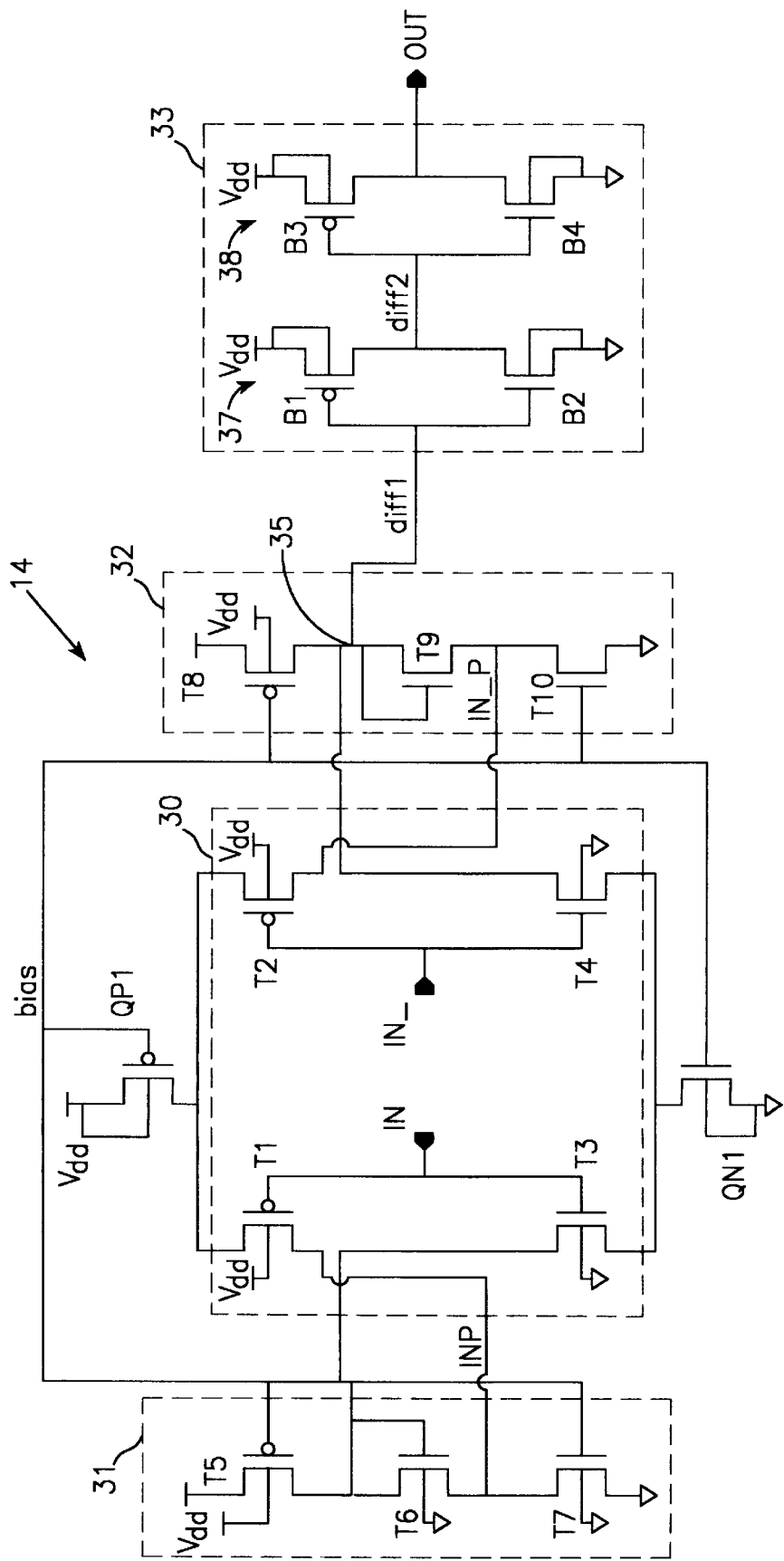
FIG. 2 is an electrical schematic illustrating the clock receiver circuit shown in FIG. 1.
Figure 3:
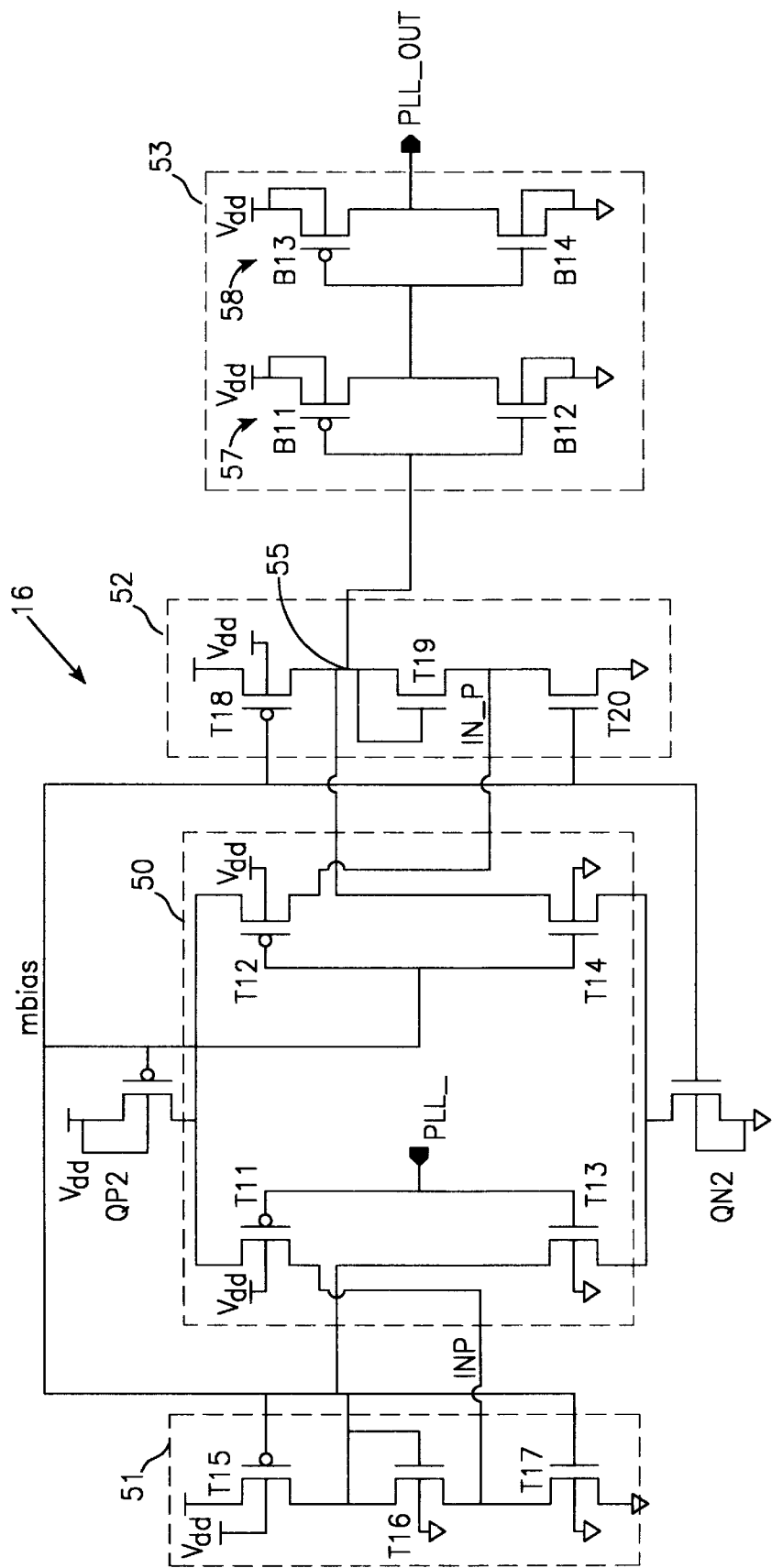
FIG. 3 is an electrical schematic illustrating the clock receiver mirror circuit shown in FIG. 1.

According to the invention and as shown in detail in FIGS. 2 and 3, the clock receiver circuit 14 and the clock receiver mirror circuit 16 have corresponding components. That is, each of the transistors of the clock receiver circuit 14 has a corresponding transistor in the clock receiver mirror circuit 16.

As shown in FIG. 2, clock receiver circuit 14 comprises a differential amplifier having its components interconnected or configured in a first configuration for receiving complementary first and second input signals IN and IN__. Referring to FIG. 3, clock receiver mirror circuit 16 comprises an amplifier having components corresponding to the components of clock receiver circuit 14, but in a second configuration for receiving only a single input PLL__. In both circuits 14 and 16, the input-to-output response time is substantially the same.

In the preferred form of the invention, the components for each circuit are laid out in a substantially identical fashion. That is, the dimensions and material of each transistor in circuit 14 are substantially the same as the dimensions and material of the corresponding transistor in circuit 16. Furthermore, the physical location of a transistor in circuit 14 relative to the other transistors of circuit 14 is substantially the same as the physical location of the corresponding transistor in circuit 16 relative to the other transistors in circuit 16. Also, the two circuits 14 and 16 are preferably located adjacent to each other on the chip 12.

Since the clock receiver circuit 14 and the clock receiver mirror circuit 16 are both made up of the same components and situated similarly on the chip in close proximity, the circuits introduce substantially the same delay $t_d$ as shown in FIG. 1. That is, the delay $t_d$ introduced by the clock receiver circuit 14 between the system clock signals and the phase-lock loop circuit 15 is substantially the same as the delay $t_d$ introduced by the clock receiver mirror circuit 16 between the clock distribution arrangement 25 and the input to the phase-lock loop circuit 15 through the feedback path. Thus, the signal at the clock signal distribution arrangement 25 is phase-aligned and frequency-aligned with the system clock signals at $t_o$. Furthermore, the similarity of the circuits, layouts, and location on the chip cause the circuits 14 and 16 to react similarly to process conditions. Therefore, a change in the delay $t_d$ produced at the clock receiver circuit 14 due to a change in process conditions, is similar to the change in the delay $t_d$ at the clock receiver mirror circuit 16 as a result of the change in process conditions.

Referring now to FIG. 2, the clock receiver circuit 14 includes an input stage 30, a biasing stage 31, and an output stage 32. Also, in the preferred form of the invention, the clock receiver circuit 14 includes a buffer arrangement 33 for conditioning the output of the circuit. The input stage 30 includes a first complementary pair of MOSFET transistors comprising PMOS transistor T1 and NMOS transistor T3. The gates of transistors T1 and T3 are coupled to a first input to the clock receiver circuit IN which receives one of the differential system clock signals. The drains of transistors T1 and T3 are coupled together across a bias set transistor T6 which is included in the biasing stage 31.

Input stage 30 also includes a second complementary pair of input transistors comprising the PMOS device T2 and NMOS device T4. The gates of both of these devices T2 and T4 are connected to a second input IN__. Second input IN__ is connected to receive the complement of the signal to the first input IN. The drains of transistors T2 and T4 are coupled together across output set transistor T9 which is included in output stage 32.

PMOS transistor QP1 comprises a first current source transistor for coupling the input stage 30 to the supply voltage $V_{dd}$ through transistors T1 and T2. Transistor QP1 has its gate connected to the bias node labeled "bias" in FIG. 2. NMOS transistor QN1 comprises a second current source transistor. Transistor QN1 couples the input stage 30 to ground through the NMOS transistors T3 and T4. The gate of transistor QN1 is also connected to the bias node. Biasing stage 31 includes the NMOS bias set transistor T6, and further includes first and second bias source transistors comprising the PMOS device T5 and the NMOS device T7. First bias source transistor T5 is coupled to supply voltage $V_{dd}$ while second bias source transistor T7 is coupled to ground. The gates of transistors T5, T6, and T7 are each connected to the bias node. As will be discussed below, the voltage on the bias node "bias" is determined by the voltage across bias set transistor T6. The bias node "bias" is coupled to the supply voltage $V_{dd}$ through first bias source transistor T5.

Output stage 32 comprises the NMOS output set transistor T9 and first and second output source transistors including PMOS transistor T8 and NMOS transistor T10. First output source transistor T8 is coupled to supply voltage $V_{dd}$ while second output source transistor T10 is coupled to ground. The drains of transistors T8 and T10 are coupled together across output set transistor T9 and their gates are both connected to the bias node "bias". The gate of output set transistor T9 is connected to output node 35 which is coupled to the supply voltage $V_{dd}$ through first output source transistor T8.

In the form of the invention illustrated in FIG. 2, the output node 35 provides a first single-ended output signal "diff1" which serves as the input to a CMOS inverter 37 included in the buffer arrangement 33. The inverter 37 includes PMOS transistor B1 and NMOS transistor B2 whose drains are coupled together and provide a second single-ended output "diff2" to a second CMOS inverter circuit 38. The second inverter circuit 38 includes PMOS transistor B3 and NMOS transistor B4. The drains of these devices B3 and B4 are coupled together and provide the clock receiver output OUT.

The operation of the clock receiver circuit 14 may now be described with reference to FIG. 2. The differential system clock signals are applied at the first and second inputs IN and IN__. When the higher-voltage signal is applied at IN and the complementary lower-voltage signal is applied at IN__, transistor T2 is biased to a more conductive state than transistor T1. At the voltage levels of the preferred system clock signals, both transistor T3 and T4 produce very little drain current in response to the signals applied at IN and IN__. However, the reduced resistance at transistor T2 increases the voltage level at the node labeled IN__P between transistors T9 and T10 of output stage 32. At the same time, the relatively higher resistance at transistor T1 causes the voltage at node INP to decrease. This reduced voltage at node INP reduces the voltage at the bias node "bias". The increased voltage at node IN__P and the decreased voltage signal at the bias node "bias" increases the voltage signal at the output node 35 to provide the first output "diff1" at the output node. This first output "diff1" is buffered and inverted at inverter 37 to produce the second output "diff2" and inverted again at inverter 38 to produce the clock receiver output OUT. It should be noted that the buffer arrangement 33 comprising inverters 37 and 38 is not necessary to the operation of the clock receiver circuit 14, and that the circuit may operate without the buffer arrangement, in which case the output is taken at the output node 35.

When the differential input signals are reversed on the first and second inputs IN and IN__, the signal at IN__ is relatively higher than the voltage signal at IN. Thus, in this condition transistor T1 becomes relatively more conductive than transistor T2. In this case, the voltage at node IN__P decreases while the voltage at node INP increases along with the voltage at the bias node "bias". The higher voltage signal at the bias node and decreased voltage at node IN__P produces a decreased voltage at the output node 35 which is buffered through the dual inverters 37 and 38 to produce a low clock signal at the clock receiver output OUT.

The clock receiver circuit 14 according to the invention and illustrated in FIG. 2 produces several advantages over prior differential amplifier circuits. First, the maximum stack height in the circuit is three, which allows the circuit to operate with lower supply voltage levels $V_{dd}$. Also, the self-biasing arrangement combined with the two complementary pairs of input transistors T1, T2, T3, and T4 used in the input stage 30 allows the circuit to operate with a wide range of input signal voltage levels.

A primary advantage of the clock receiver circuit 14 shown in FIG. 2 is that the circuit may be modified slightly without changing components to produce the clock receiver mirror circuit 16 shown in FIG. 3. Clock receiver mirror circuit 16 includes components identical to the components used in clock receiver circuit 14 shown in FIG. 2. However, clock receiver mirror circuit 16 is adapted to receive only a single input at PLL__ and produce a single output at PLL__OUT. In the clock receiver system 10 shown in FIG. 1, clock receiver mirror circuit 16 comprises the circuit shown in FIG. 3 with the clock signal at the on-chip clock distribution arrangement 25 connected as the input to PLL__ and with the mirror clock output at PLL__OUT.

Since the components of the two circuits shown in FIGS. 2 and 3 are identical, the two circuits may be laid out similarly on the integrated circuit chip (12 in FIG. 1) and with the two circuits 14 and 16 positioned adjacent to each other on the integrated circuit chip 12 the circuits react similarly to process changes. Thus, the delays introduced by the two circuits 14 and 16 are very similar over a wide range of process conditions. This similarity in delay reduces the skew or clock error between the system clock signals and the on-chip clock signal.

As shown in FIG. 3, the clock receiver mirror circuit 16 includes mirror input stage 50, mirror biasing stage 51, and mirror output stage 52. Current source transistors QP2 and QN2 provide current for the mirror input stage 50 and buffer arrangement 53 buffers the output from the output stage similarly to the buffer arrangement 33 shown in FIG. 2.

Input stage 50 of the clock receiver mirror circuit 16 includes a complementary pair of input transistors comprising PMOS device T11 and NMOS device T13. The gates of devices T11 and T13 are coupled together to the input of the circuit PLL__. The drains of transistors T11 and T13 are coupled together across mirror bias transistor T16 of mirror biasing stage 51.

Input stage 50 of the mirror clock receiver circuit 16 further includes a second complementary pair of transistors comprising PMOS device T12 and NMOS device T14. Transistors T12 and T14 have their gates coupled together to the mirror bias node "mbias" while their drains are coupled together across mirror output transistor T19 of output stage 52.

The two current source transistors QP2 and QN2 provide current for the input stage 50 of the clock receiver mirror circuit 16. First current source transistor QP2 couples PMOS transistors T11 and T12 of the input stage 50 to supply voltage $V_{dd}$. Second current source transistor QN2 couples NMOS transistors T13 and T14 of the input stage 50 to ground.

Mirror biasing stage 51 includes the mirror bias NMOS transistor T16, and first and second bias source transistors comprising PMOS transistor T15 and NMOS transistor T17. First bias source transistor T15 couples the biasing stage 51 to the supply voltage $V_{dd}$, whereas second bias source transistor T17 couples the biasing stage to ground. The gates of transistors T15, T16, and T17 are connected to the mirror bias node "mbias".

Mirror output stage 52 comprises the mirror output transistor T19 and first and second mirror output source transistors PMOS device T18 and NMOS device T20. First mirror output source transistor T18 couples the output stage 52 to supply voltage $V_{dd}$, while second mirror output source transistor T20 couples the output stage to ground. A first output from the circuit is taken at mirror output node 55 between transistors T18 and T19. Mirror output node 55 is coupled to supply voltage $V_{dd}$ through first mirror output source transistor T18.

In the illustrated form of the invention the first output at mirror output node 55 is applied as an input to first mirror inverter 57. The mirror inverter 57 includes PMOS transistor B11 which couples the inverter to the supply voltage $V_{dd}$, and NMOS transistor B12 which couples the inverter to ground. The mirror inverter 57 produces a second output which is applied to second inverter 58. Second inverter 58 comprises PMOS transistor B13 which couples the inverter to the supply voltage $V_{dd}$, and NMOS transistor B14 which couples the inverter to ground. The output of inverter 58 provides the mirror clock output "PLL_OUT".

The operation of the clock receiver mirror circuit 16 according to the invention may now be described with reference to FIG. 3. When a single-ended clock signal such as the distributed on-chip clock signal from clock distribution arrangement 25 shown in FIG. 1 is applied to the mirror input at PLL_, the higher-voltage state of the signal causes transistor T11 to become less conductive decreasing the voltage at node INP. The voltage of the mirror bias node "mbias" follows the voltage at INP resulting in a higher drain current in transistors T12 and T18. The higher drain current in transistors T12 and T18 increases the voltage at IN_P and the voltage at the mirror output node 55 between transistors T18 and T19 to produce a high clock signal. This high clock signal is buffered through the buffer arrangement 53 to produce the mirror clock output at PLL_OUT.

When the clock input applied at PLL_ moves to its lower voltage state, the drain current increases in transistor T11 increasing the voltage at node INP. The voltage at the bias node "mbias" increases following the voltage at node INP. This increased voltage on the mirror bias node "mbias" reduces the drain current at transistor QP2, transistor T12, and transistor T18, reducing the voltage at mirror output node 55. This reduced voltage signal at the mirror output node 55 represents a low clock signal which is buffered through the buffer arrangement 53 to produce the low signal at PLL_OUT.

While the present invention has been disclosed in connection with the preferred embodiment thereof, it should be understood that there may be other embodiments which fall within the spirit and scope of the invention as defined by the following claims. For example, although the illustrated circuits are implemented using metal oxide field effect transistors, other transistor devices may be used within the scope of the invention.

What is claimed is:

1. A clock receiver system comprising:
   (a) a clock receiver circuit having a plurality of components, the clock receiver circuit including first and second clock inputs and a clock receiver output;
   (b) a phase lock loop circuit having a first input, a second input, and a phase lock loop output connected to a clock distribution arrangement, the first input being connected to the clock receiver output of the clock receiver circuit; and
   (c) a clock receiver mirror circuit having a plurality of components, each of the components of the clock receiver mirror circuit corresponding to a respective one of the components of the clock receiver circuit, the clock receiver mirror circuit also having a mirror circuit input connected to receive a distributed clock signal from the clock distribution arrangement and further having a mirror clock output connected to the second input of the phase lock loop circuit.

2. The clock receiver system of claim 1 wherein:
   (a) the components of the clock receiver circuit have substantially the same layout as the components of the clock receiver mirror circuit.

3. The clock receiver system of claim 2 wherein:
   (a) the clock receiver circuit and the clock receiver mirror circuit are both implemented on an integrated circuit chip and are located adjacent to each other on the integrated circuit chip.

4. The clock receiver system of claim 1 wherein the clock receiver circuit includes:
   (a) a biasing stage for providing a bias signal at a bias node;
   (b) an input stage connected to the first and second clock inputs; and
   (c) an output stage connected to the bias node and to the input stage.

5. The clock receiver system of claim 4 wherein the clock receiver mirror circuit includes:
   (a) a mirror biasing stage for providing a mirror bias signal at a mirror bias node;
   (b) a mirror input stage connected to receive the distributed clock signal from the clock distribution arrangement, and also connected to the mirror bias node; and
   (c) a mirror output stage connected to the mirror bias node and to the mirror input stage.

6. The clock receiver system of claim 5 further comprising:
   (a) a receiver buffer connected between the output stage and the clock receiver output; and
   (b) a mirror buffer connected between the mirror output stage and the mirror clock output.

7. The clock receiver system of claim 5 wherein:
   (a) the clock receiver circuit input stage is connected to a supply voltage with a first current source transistor and to ground with a second current source transistor and comprises a first complementary pair of input transistors and a second complementary pair of input transistors, the first pair of input transistors having their gates connected to the first clock input and having their drains coupled together across a bias set transistor of the biasing stage, the second pair of input transistors having their gates connected to the second input and having their drains coupled together across an output set transistor of the output stage, and the first and second current source transistors having their gates connected to the bias node;
   (b) the clock receiver circuit biasing stage comprises the bias set transistor and first and second bias source transistors, the first and second bias source transistors connected between the supply voltage and ground and the drains of the first and second bias source transistors being coupled together across the bias set transistor, the bias set transistor and first and second bias source transistors each having their respective gate connected to the bias node, and the bias node coupled to the supply voltage with the first bias source transistor; and
   (c) the clock receiver circuit output stage comprises the output set transistor and first and second output source transistors, first and second output source transistors connected between the supply voltage and ground and the drains of the first and second output source transistors being coupled together across the output set transistor, the first and second output source transistors each having its respective gate connected to the bias node, and the output set transistor having its gate connected to an output node which is coupled to the supply voltage through the first output source transistor.

8. The clock receiver system of claim 7 wherein:
   (a) the mirror input stage is connected to the supply voltage with a first mirror current source transistor and to ground with a second mirror current source transistor and comprises a first complementary pair of mirror input transistors and a second complementary pair of mirror input transistors, the first pair of mirror input transistors each having their respective gate connected to receive the distributed clock signal from the clock distribution arrangement and having their drains coupled together across a mirror bias transistor of the mirror biasing stage, the second pair of mirror input transistors each having their respective gate connected to the mirror bias node and having their drains coupled together across a mirror output transistor of the mirror output stage, and the first and second mirror current source transistors having their gates connected to the mirror bias node;

(b) the mirror biasing stage comprises the mirror bias transistor and first and second mirror bias source transistors, the first and second mirror bias source transistors connected between the supply voltage and ground and the drains of the first and second mirror bias source transistors being coupled together across the mirror bias transistor, the mirror bias transistor and first and second mirror bias source transistors each having their respective gate connected to the mirror bias node, and the mirror bias node coupled to the supply voltage with the first mirror bias source transistor; and (c) the mirror output stage comprises the mirror output transistor and first and second mirror output source transistors, the first and second mirror output source transistors connected between the supply voltage and ground and the drains of the first and second mirror output source transistors being coupled together across the mirror output transistor, the first and second mirror output source transistors each having its respective gate connected to the mirror bias node, and the mirror output transistor having its gate connected to a mirror output node which is coupled to the supply voltage through the first output source transistor.

9. A method of receiving complementary system clock signals, the method comprising the steps of:

(a) converting the complementary system clock signals to a single-ended clock signal with a clock receiver circuit; and (b) phase locking the single-ended clock signal with a mirror clock signal produced by a clock receiver mirror circuit having components which correspond to components of the clock receiver circuit.

10. The method of claim 9 wherein the step of phase locking the single-ended clock signal with the mirror clock signal comprises the steps of:

(a) applying the single-ended clock signal to the first input of a phase lock loop circuit;

(b) applying an output of the phase lock loop circuit to a clock distribution arrangement;

(c) applying the clock signal at the clock distribution arrangement to an input of the clock receiver mirror circuit; and (d) applying an output of the clock receiver mirror circuit to a second input of the phase lock loop circuit.

11. The method of claim 10 wherein:

(a) the step of converting the complementary system clock signals to the single-ended clock signal with the clock receiver circuit is performed using circuit components identical to the circuit components used by the clock receiver mirror circuit to produce the mirror clock signal.

12. A clock receiver circuit comprising:

(a) a receiver input stage connected to a supply voltage with a first current source transistor and to ground with a second current source transistor and comprising a first complementary pair of input transistors and a second complementary pair of input transistors, the first pair of input transistors each having its respective gate connected to a first receiver circuit input and having their drains coupled together across a bias set transistor, the second pair of input transistors each having its respective gate connected to a second receiver circuit input and having their drains coupled together across an output set transistor, and the first and second current source transistors having their gates connected to a bias node;

(b) a biasing stage comprising the bias set transistor and first and second bias source transistors, the first and second bias source transistors connected between the supply voltage and ground and the drains of the first and second bias source transistors being coupled together across the bias set transistor, the bias set transistor and first and second source transistors each having their respective gate connected to the bias node, and the bias node coupled to the supply voltage with the first bias source transistor; and (c) an output stage comprising the output set transistor and first and second output source transistors, the first and second output source transistors connected between the supply voltage and ground and the drains of the first and second output source transistors being coupled together across the output set transistor, the first and second output source transistors each having its respective gate connected to the bias node, and the output set transistor having its gate connected to an output node, which is coupled to the supply voltage through the first output source transistor.

13. The clock receiver circuit of claim 12 further comprising:

(a) a buffer arrangement connected to the output node and having a buffer output which comprises an output for the clock receiver circuit.

14. The clock receiver circuit of claim 13 wherein the buffer arrangement comprises:

(a) a first inverter having an input connected to the output node; and (b) a second inverter having an input connected to an output of the first inverter, and having an output comprising the buffer output.

* * * * *